United States Patent
Tsai et al.

(10) Patent No.: US 6,800,535 B1
(45) Date of Patent: Oct. 5, 2004

(54) METHOD FOR FORMING BOTTLE-SHAPED TRENCHES

(75) Inventors: Tzu-Ching Tsai, Taoyuan (TW); Yi-Nan Chen, Taipei (TW); Hsin-Jung Ho, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/645,681

(22) Filed: Aug. 21, 2003

(30) Foreign Application Priority Data

Apr. 9, 2003 (TW) .......................................... 92108094 A

(51) Int. Cl.[7] .............................................. H01L 21/20
(52) U.S. Cl. ...................................... 438/386; 438/243
(58) Field of Search ................................ 438/386, 387, 438/388, 389, 391, 392, 243, 244, 245, 246, 247, 248

(56) References Cited

U.S. PATENT DOCUMENTS

| | | | | |
|---|---|---|---|---|
| 5,629,226 A | * | 5/1997 | Ohtsuki .......................... | 438/389 |
| 5,658,816 A | * | 8/1997 | Rajeevakumar ............... | 438/386 |
| 6,190,988 B1 | * | 2/2001 | Furukawa et al. ........... | 438/386 |
| 6,214,686 B1 | * | 4/2001 | Divakaruni et al. ......... | 438/386 |
| 6,232,171 B1 | * | 5/2001 | Mei ............................ | 438/246 |
| 6,313,008 B1 | * | 11/2001 | Leung et al. ................ | 438/424 |
| 6,716,757 B2 | * | 4/2004 | Lin et al. ..................... | 438/705 |

* cited by examiner

*Primary Examiner*—David Nhu
(74) *Attorney, Agent, or Firm*—Quintero Law Office

(57) ABSTRACT

A method for forming bottle-shaped trenches. First, a substrate is provided. Next, a hard mask with openings is formed on the substrate. The substrate is etched through the openings to form trenches with an upper portion and a lower portion. An isolated layer is formed conformally on the hard mask and in the trenches. A shield layer is formed in the lower portion of the trenches. A part of the insulating layer, which is not covered by the shield layer, is then removed. A protective layer is formed on the upper portion of the trenches. The shield layer and the isolated layer are removed. Finally, the substrate of the lower part of the trenches is wet etched using the protective layer as a mask so as to form bottle-shaped trenches.

27 Claims, 6 Drawing Sheets

METHOD FOR FORMING BOTTLE-SHAPED TRENCHES

BACKGROUND OF THE INVENTION

1. Field of the Invention

The present invention relates to a semiconductor manufacturing process and in particular to a method for forming deep trenches in dynamic random access memory (DRAM).

2. Description of the Related Art

DRAM is capable of reading and writing information. Each DRAM cell requires only one transistor and one capacitor; therefore, it is easy to achieve higher integration and is broadly applicable to computers and electronic equipment. A trench capacitor, formed in the semiconductor silicon substrate, is one of the most commonly used capacitors. The surface area of the trench capacitor is increased by deepening the trench capacitor in the semiconductor silicon substrate thereby increasing capacitance. A chip with trench capacitors can be separated into a memory cell array area to store data and a decoupling capacitor area to filter noise.

In the conventional trench capacitor fabrication method, a plurality of trenches is formed in a semiconductor silicon substrate. The silicon semiconductor substrate with trenches covers an As-doped silicon oxide layer. The silicon oxide layer is patterned with lower electrode patterns by coating and baking a photoresist. The photoresist can flow into the trenches in the baking step. After baking, the hardened photoresist is removed by dry etching until the upper surface of the photoresist is lower than that of the semiconductor silicon substrate by a predetermined distance. The exposed silicon oxide layer is removed using the photoresist as a mask. Then, the doped As ions in the silicon oxide layer are driven into the semiconductor silicon substrate to form a conductive layer as a lower electrode of the trench capacitor. The capacitance of the trench capacitor is related to the surface area of the lower electrode, and determined by the area of the silicon oxide layer covering the trench. The area of the silicon oxide layer covering the trench is controlled by the distance between the upper surface of the photoresist and that of the semiconductor silicon substrate. However, the distance is difficult to control.

Adhesion between the photoresist and the silicon oxide layer is too weak to drive the photoresist flow into the trench after spin coating. During the baking of the photoresist, the photoresist can flow into the trenches. Nevertheless, the densities of the trenches in the memory cell array area and in the decoupling capacitor area are different. A mass of the photoresist flows into the trenches in the higher density area (the memory cell array area) so that the surface of the hardened photoresist is lower. A small quantity of the photoresist flows into the trenches in the lower density area (the decoupling capacitor area) so that the surface of the hardened resist is higher. Therefore, there is a height difference between the surfaces of the hardened resist in different areas.

Moreover, the difference between the distances between the upper surface of the photoresist and that of the semiconductor silicon substrate in different trenches exists after etching the photoresist. Under the 0.175 $\mu$m design requirement, for example, the above-mentioned difference reaches 8200 Å. In order to prevent the lower electrode in the lower density area (the decoupling capacitor area) and the buried strap (or the so-called ion doped band) from subsequently forming in the top of the semiconductor silicon substrate by shorting, the lower electrode formed in the memory cell array area has a smaller surface area, which is detrimental to storage performance. In order to increase the surface area of the lower electrode in the memory cell array area, the breakdown voltage between the lower electrode in the decoupling capacitor area and the buried strap must be reduced, but the reduction may cause a short circuit. Therefore, etching the photoresist is difficult and it is possible that the entire process may fail.

In order to solve the photoresist layer uniformity problem, a method of improving uniformity is provided in which the substrate is modified to enhance the adhesion between the substrate and the photoresist layer. The modification of the substrate comprises an oxygen plasma treatment, a wet treatment with a mixed solution of $H_2SO_4$ and $H_2O_2$, or a wet treatment with a mixed solution of $NH_4OH$ and $H_2O_2$. After this modification, the difference between the upper surfaces of the recessed photoresist layer in each of the trenches is controlled and reduced by 3000–4000 Å.

When the design requirement reaches 0.11 $\mu$m, however, the difference in non-uniformity between the recessed photoresist layers in each of the trenches can reach 7000–8000 Å. Therefore, a method of improving uniformity in the photoresist layer is required.

SUMMARY OF THE INVENTION

Accordingly, an object of the invention is to provide a method for forming bottle-shaped trenches, such that all trenches have the same depth regardless of whether the trenches are located in a dense area or in an isolated area.

It is another object of the present invention to provide a method for forming bottle-shaped trenches to prevent the capacitors in the decoupling capacitor area from invalidation and prevent capacitance reduction in the memory cell array area.

It is still another object of the present invention to provide a method for forming bottle-shaped trenches which are suitable for fabricating trench capacitors to increase breakdown voltage between the lower electrode and the dopants and enhance the reliability of the trench capacitors.

It is a further object of the present invention to provide a method for forming bottle-shaped trenches to simplify the manufacturing process and increase process windows.

One feature of the present invention is the use of polysilicon as a shield layer to replace the photoresist in the conventional bottle-shaped trenches manufacturing technology to avoid non-uniformity of photoresist recesses which lead to different depths of each of the lower electrodes.

Another feature of the present invention is the formation of the protective layer comprising a nitride on the sidewall of the upper portion of the trenches by deposition, such that the thickness of the protective layer can be effectively controlled. Compared to the prior art of the formation of the nitride protective layer by nitridation, the thick protective layer of the present invention can sufficiently protect the upper portion of the trenches from damaging during wet etching for forming bottle-shaped trenches. However, the conventional nitride protective layer is not thick enough to provide sufficient protection during wet etching, such that the bottom area of the bottle-shaped trench is limited.

To achieve the above objects, one aspect of the present invention provides a method for forming bottle-shaped trenches. First, a substrate is provided. Next, a hard mask with openings is formed on the substrate. The substrate is etched through the openings to form trenches with an upper portion and a lower portion. An isolated layer is formed conformally on the hard mask and in the trenches. A shield layer is formed in the lower portion of the trenches. A part of the insulating layer, which is not covered by the shield layer, is then removed. A protective layer is formed on the upper portion of the trenches. The shield layer and the isolated layer are removed. Finally, the substrate of the lower part of the trenches is wet etched using the protective layer as a mask so as to form bottle-shaped trenches.

According to the present invention, the protective layer comprises dopants driven into the substrate surrounded the protective layer by thermal treatment. The material of the protective layer comprises a nitride. The formation of the protective layer comprises the steps as following. First, the protective layer is conformally formed on the sidewall and the bottom of the trenches by chemical vapor deposition (CVD). Then, parts of the protective layer on the bottom of the trenches are removed to leave parts of the protective layer on the sidewall of the trenches.

According to the present invention, the shield layer comprises polysilicon. The formation of the shield layer in the lower portion of the trenches comprises the steps as following. First, the shield layer is formed to fill the trenches. Then, parts of the shield layer in the upper portion of the trenches are removed so as to leave parts of the shield layer in the lower portion of the trenches.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

Figure 1:
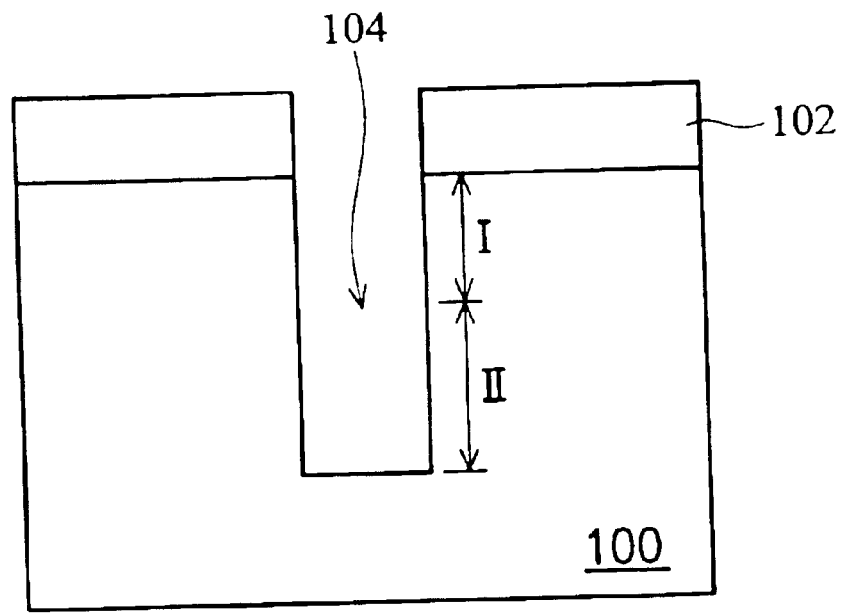
FIGS. 1 through 11 are cross-sections showing the method of forming bottle-shaped trenches according to one embodiment of the invention.

With reference to FIG. 1, first, a substrate 100 comprising silicon is provided.

Next, a hard mask 102 is preferably formed on the substrate 100. Then, opening patterns are defined in the hard mask 102 by photolithography using a photoresist as a mask. After development, openings are formed in the hard mask 102. The substrate 100 is subsequently etched through the openings by an anisotropic etching using etching agents comprising HBr, $NF_3$, $O_2$, and He to form trenches 104 in the substrate 100. The thickness of the trenches 104 divided into two parts comprising a upper portion I and a lower portion II is about 60000–80000 Å.

Figure 2:
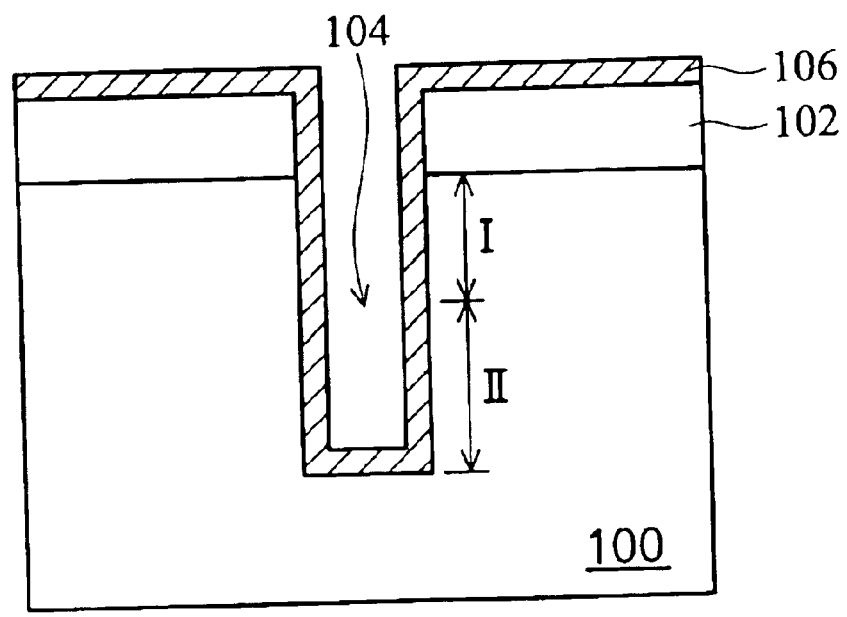

As shown in FIG. 2, a conformally isolated layer 106 is preferably formed on the hard mask 102 and in the bottom and the sidewall of the trenches 104 by chemical vapor deposition (CVD). The thickness of the isolated layer 106 comprising a silicon oxide is about 100–300 Å. The isolated layer 106 preferably has dopants comprising As therein.

Figure 3:
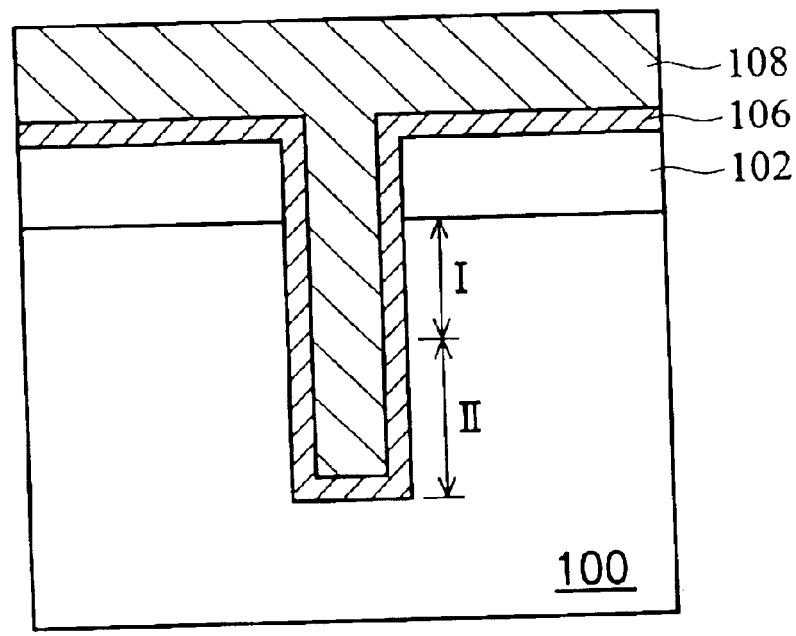

As shown in FIG. 3, a shield layer 108 is preferably formed by chemical vapor deposition (CVD) to fill the trenches. The thickness of the shield layer 108 comprising polysilicon is about 2000–4000 Å. It is a key feature of the present to replace the conventional photoresist with the polysilicon shield layer 108.

Figure 4:
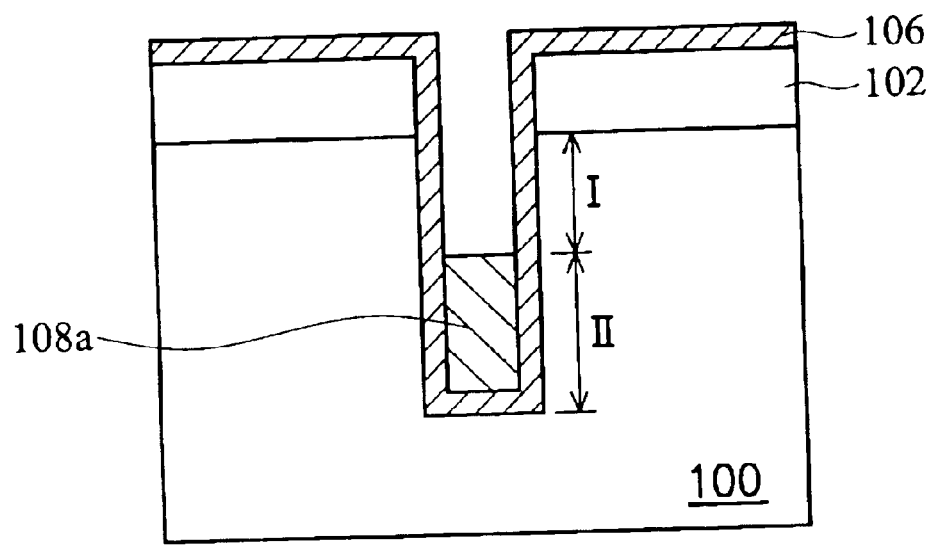

A portion of the shield layer 108 is removed by buffered oxide etchant (BOE) to leave a part of the shield layer 108a located in the lower portion II of the trenches 104, as shown in FIG. 4. The remaining shield layer 108a is formed in the lower portion II of the trenches 104. Thus, the distance between the surface of the remaining shield layer 108a and the surface of the substrate 100 can be effectively controlled and be about 8000–14000 Å. Compared to the prior art, the density of the shield layer 108 of the present invention formed by CVD is more uniform, such that the distances of each of the trenches 104 are all the same.

Figure 5:
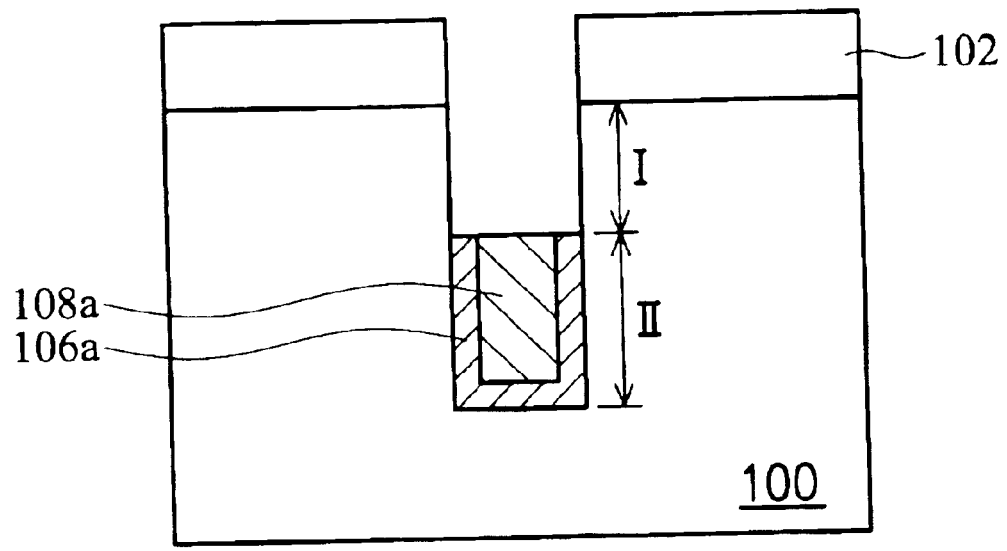

As shown in FIG. 5, a part of the insulating layer 106, which is not covered by the remaining shield layer 108a, is removed by etching solutions comprising $HPO_4$. Thus, the surface of the sidewall of the upper portion I of the trenches 104 is exposed, and the remaining insulating layer 106a is covered on the sidewall and the bottom of the lower portion II of the trenches.

Figure 6:
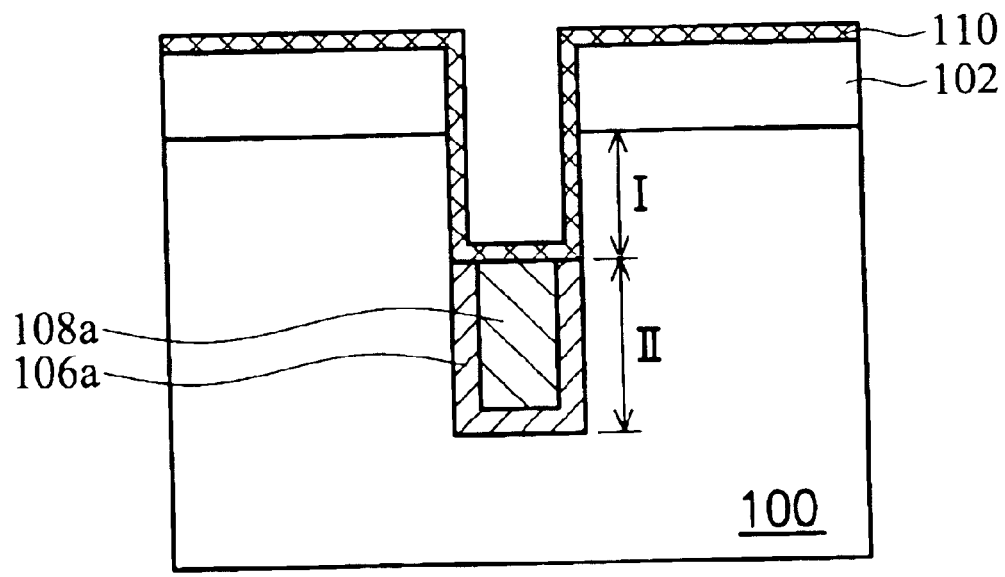

In FIG. 6, a protective layer 110 comprising a nitride is preferably formed on the remaining shield layer 108a and on the sidewall of the upper portion I of the trenches 104 by CVD. The thickness of the protective layer 110 is about 100–300 Å. Usually, the thickness of the conventional protective layer is about 30–40 Å. Compare to the prior art, the thickness of the protective layer 110 of the present invention formed by deposition can be better controlled. The protective layer 110 is thicker, and the bottom area of the trenches 104, formed by wet etching is larger.

Figure 7:
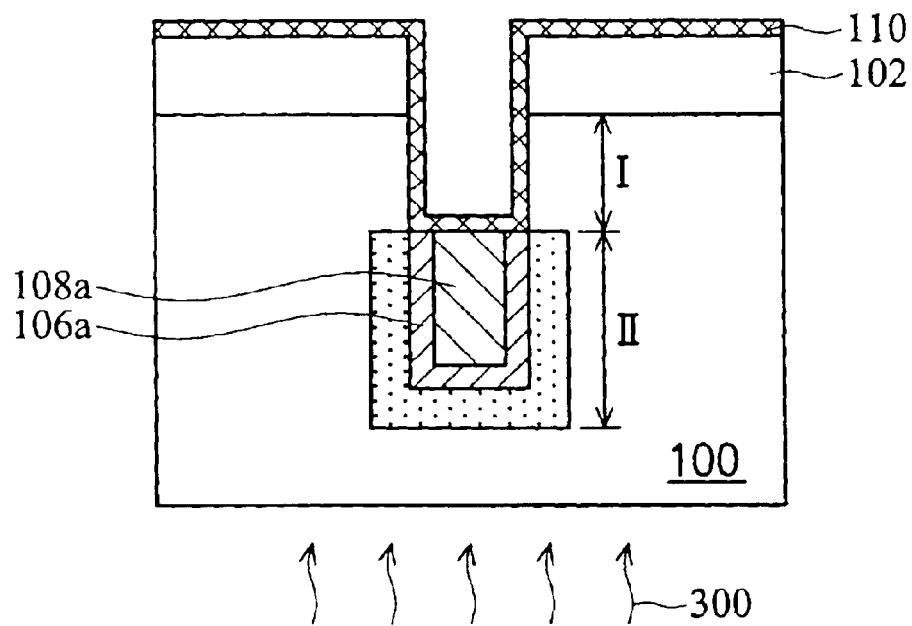

In FIG. 7, a thermal treatment 300 is preferably performed in the substrate 100 at about 800–1000° C. Thus, the dopants in the remaining insulating layer 106a can be driven into the substrate 100 of the lower portion II of the trenches.

Figure 8:
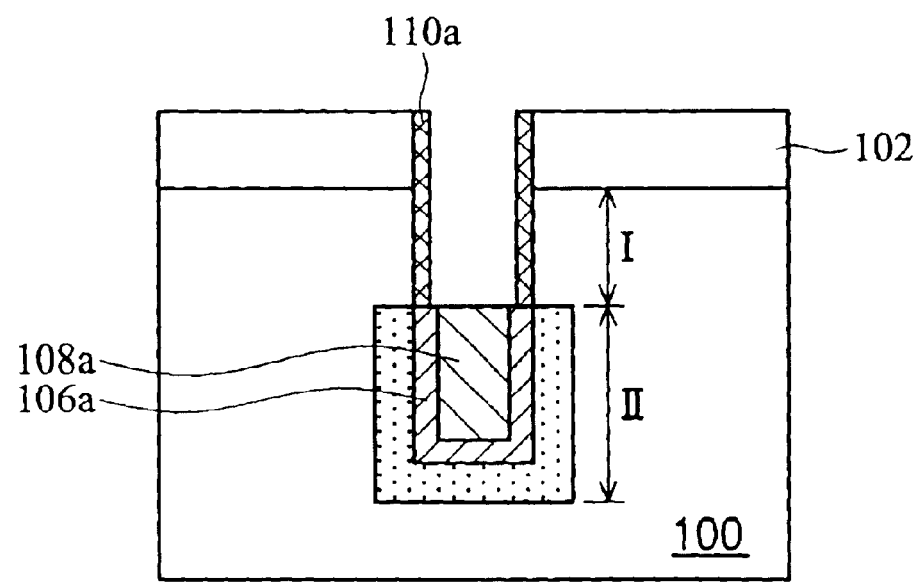

Parts of the protective layer 110 located on the hard mask 102 and the remaining shield layer 108a are preferably removed by an anisotropic etching, as shown in FIG. 8. The remaining protective layer 110a is located on the sidewall of the upper portion of the trenches.

Figure 9:
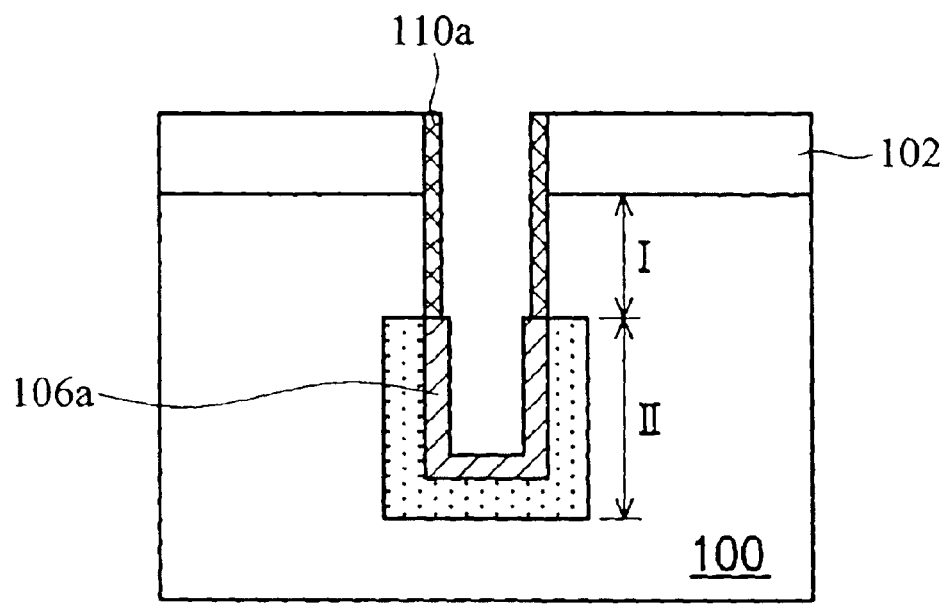

As shown in FIG. 9, the remaining shield layer 108a is preferably removed by an etching solution comprising HF, such that the remaining insulating layer 106a is exposed.

Figure 10:
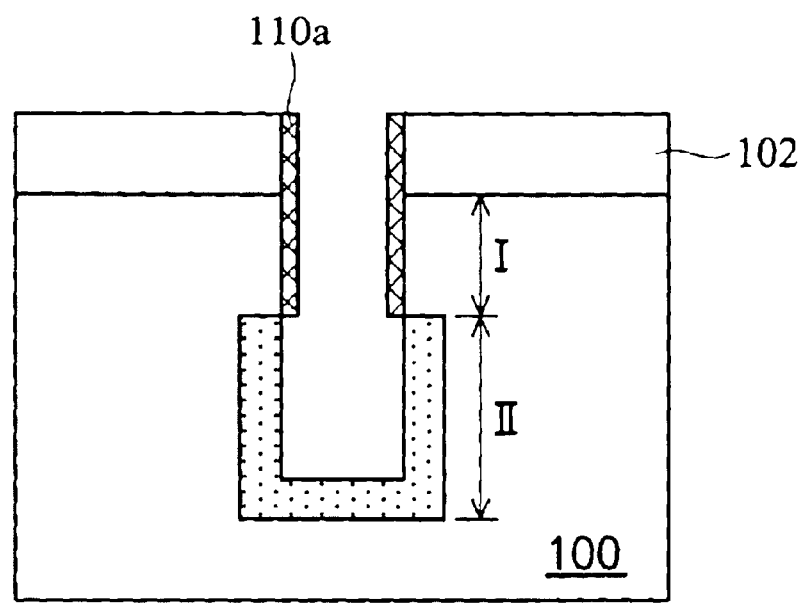

As shown in FIG. 10, the remaining insulating layer 106a is removed to expose the substrate 100 of the lower portion II of the trenches 104.

Figure 11:
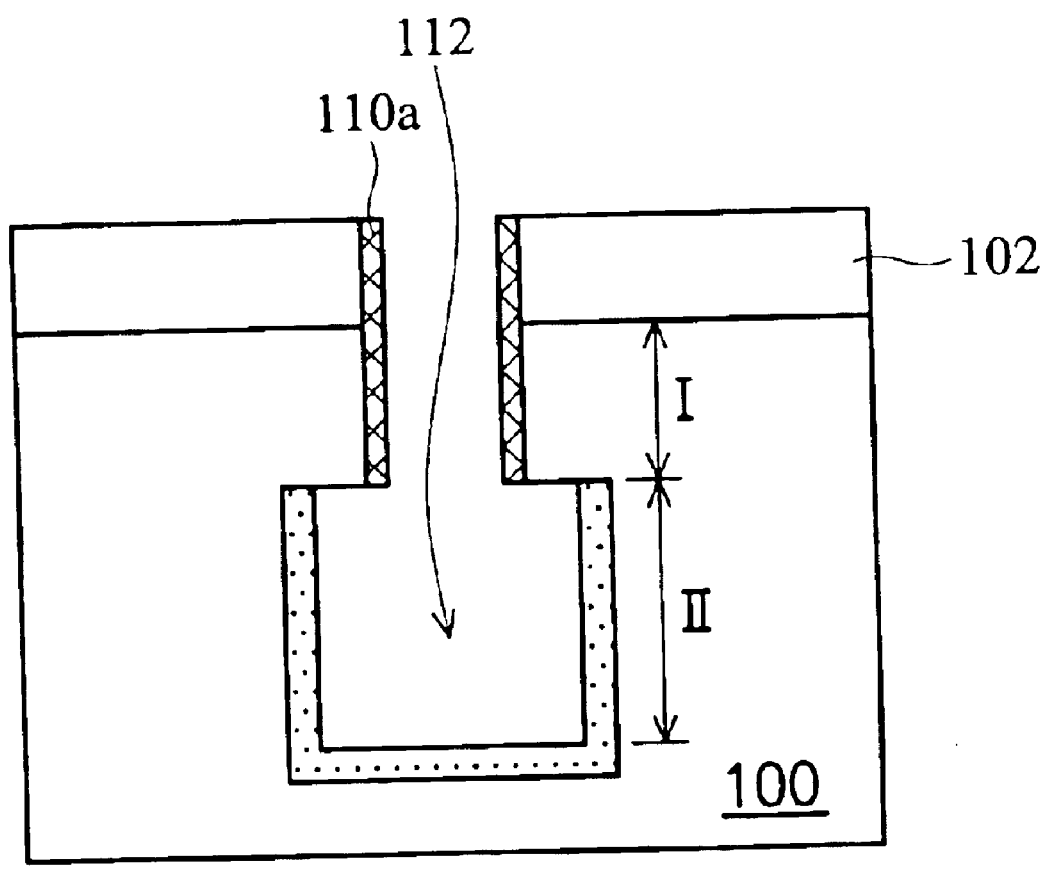

Finally, as shown in FIG. 11, the exposed substrate 100 of the lower part II of the trenches 104 is wet etched using the remaining protective layer 110a as a mask so as to form bottle-shaped trenches. The increased thickness of the protective layer 110 enables the area of the bottom of the bottle-shaped trenches formed by etching to be enlarged.

The bottle-shaped trenches can be further processed to form bottle-shaped trench capacitors.

The present invention has several advantages as described in the following. First, the depth of the bottom region of the bottle-shaped trenches can be effectively controlled, increasing the manufacturing yield of the lower electrodes of the bottle-shaped trench capacitors. Second, according to the present invention, controlling the size of the bottle-shaped trench can prevent the capacitors in the decoupling capacitor area from invalidation and prevent reduced capacitance in the memory cell array area. Third, according to the present invention, controlling the size of the bottle-shaped trench can improve the yield of manufacturing lower electrodes of the bottle-shaped trench capacitors. Fourth, the process of manufacturing bottle-shaped trenches of the present invention is simplified to increase the process window. Sixth, the protective layer of the present invention formed by deposition is beneficial for increasing the capacity of the bottle-shaped trench capacitors.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming bottle-shaped trenches, suitable for use in a dynamic random access memory (DRAM), comprising:
   providing a substrate;
   forming a hard mask having openings on the substrate;
   etching the substrate through the openings to form trenches with an upper portion and a lower portion;
   conformally forming an isolated layer in the trenches and on the hard mask;
   forming a shield layer in the lower portion of the trenches;
   removing parts of the isolated layer which is not covered by the shield layer to expose a surface of the upper portion of the trenches;
   forming a protective layer on sidewells of the upper portion of the trenches;
   removing the shield layer to expose the isolated layer in the lower portion of the trenches;
   removing the isolated layer to expose the substrate of the lower portion of the trenches; and
   etching the substrate of the lower portion of the trenches using the protective layer as a mask to form bottle-shaped trenches.

2. The method as claimed in claim 1, wherein the substrate comprises silicon.

3. The method as claimed in claim 2, wherein the hard mask comprises a nitride.

4. The method as claimed in claim 1, wherein the trenches are etched by an anisotropic etching.

5. The method as claimed in claim 1, wherein the isolated layer comprises an oxide.

6. The method as claimed in claim 5, wherein the isolated layer is formed by chemical vapor deposition (CVD).

7. The method as claimed in claim 1, wherein the protective layer further comprises dopants.

8. The method as claimed in claim 7, wherein after forming the protective layer further comprises driving the dopants into the substrate surrounding the protective layer by thermal treatment.

9. The method as claimed in claim 1, wherein the shield layer comprises polysilicon.

10. The method as claimed in claim 8, wherein the step of forming a shield layer in the lower portion of the trenches comprises:
    forming the shield layer to fill the trenches;
    removing parts of the shield-layer in the upper portion of the trenches to leave parts of the shield layer in the lower portion of the trenches.

11. The method as claimed in claim 1, wherein the shield layer is formed by chemical vapor deposition (CVD).

12. The method as claimed in claim 1, wherein the protective layer comprises a nitride.

13. The method as claimed in claim 12, wherein the protective layer is formed by chemical vapor deposition (CVD).

14. A method for forming bottle-shaped trenches, suitable for use in a dynamic random access memory (DRAM), comprising:
    providing a substrate;
    forming a hard mask having openings on the substrate;
    etching the substrate through the openings to form trenches with an upper portion and a lower portion;
    conformally forming an isolated layer in the trenches and on the hard mask;
    forming a shield layer in the lower portion of the trenches;
    removing parts of the isolated layer which is not covered by the shield layer to expose a surface of the upper portion of the trenches;
    conformally forming a protective layer on sidewalls and the bottom of the trenches;
    removing parts of the protective layer on the bottom of the trenches to leave parts of the protective layer on the sidewall of the trenches;
    removing the shield layer to expose the isolated layer in the lower portion of the trenches;
    removing the isolated layer to expose the substrate of the lower portion of the trenches; and
    etching the substrate of the lower portion of the trenches using the protective layer as a mask so as to form bottle-shaped trenches.

15. The method as claimed in claim 14, wherein the substrate comprises silicon.

16. The method as claimed in claim 14, wherein the hard mask comprises a nitride.

17. The method as claimed in claim 14, wherein the trenches are etched by an anisotropic etching.

18. The method as claimed in claim 14, wherein the isolated layer comprises an oxide.

19. The method as claimed in claim 18, wherein the isolated layer is formed by chemical vapor deposition (CVD).

20. The method as claimed in claim 14, wherein the protective layer further comprises dopants.

21. The method as claimed in claim 20, wherein after formation of the protective layer, dopants are driven into the substrate surrounding the protective layer by thermal treatment.

22. The method as claimed in claim 14, wherein the shield layer comprises polysilicon.

23. The method as claimed in claim 14, wherein the step of forming a shield layer in the lower portion of the trenches comprises:
    forming the shield layer to fill the trenches;
    removing parts of the shield layer in the upper portion of the trenches to leave paths of the shield layer in the lower portion of the trenches.

24. The method as claimed in claim 14, wherein the shield layer is formed by chemical vapor deposition (CVD).

25. The method as claimed in claim 14, wherein the protective layer comprises a nitride.

26. The method as claimed in claim 25, wherein the protective layer is formed by chemical vapor deposition (CVD).

27. A method for forming bottle-shaped trenches, suitable for use in a dynamic random access memory (DRAM), comprising:
    providing a substrate;
    forming a hard mask having openings on the substrate;
    etching the substrate through the openings to form trenches with an upper portion and a lower portion;

conformally forming an isolated layer in the trenches and on the hard mask;

forming a shield layer in the lower portion of the trenches covered with the isolated layer;

removing parts of the isolated layer which is not covered by the shield layer to expose a surface of the upper portion of the trenches;

forming a protective layer on sidewalls of the upper portion of the trenches;

removing the shield layer to expose the isolated layer in the lower portion of the trenches;

removing the isolated layer to expose the substrate of the lower portion of the trenches; and etching the substrate of the lower portion of the trenches using the protective layer as a mask to form bottle-shaped trenches.

* * * * *